United States Patent [19]

Kelley, Jr.

[11] 4,135,128

[45] Jan. 16, 1979

[54] APPARATUS FOR SENSING THE REACTIVE OR REAL COMPONENTS OF CURRENT

[75] Inventor: Fred W. Kelley, Jr., Media, Pa.

[73] Assignee: General Electric Company, Philadelphia, Pa.

[21] Appl. No.: 837,485

[22] Filed: Sep. 28, 1977

[51] Int. Cl.² .............................................. H02J 3/18
[52] U.S. Cl. .................................. 323/124; 323/119; 324/107; 361/63
[58] Field of Search .............. 323/101, 106, 108–110, 323/120, 119, 121, 122, 124, 127, 128; 307/125, 126, 130, 131; 361/63; 324/86, 107; 13/12, 13

[56] References Cited

U.S. PATENT DOCUMENTS

| | | | |
|---|---|---|---|
| 3,673,455 | 6/1972 | Dewey | 361/63 |
| 3,858,105 | 12/1974 | Gyugyi | 323/124 |
| 3,936,727 | 2/1976 | Kelley et al. | 323/102 |
| 3,968,432 | 7/1976 | Kelley, Jr. | 324/107 |
| 3,992,661 | 11/1976 | Kelley, Jr. | 323/124 |
| 4,017,790 | 4/1977 | Friedlander | 323/124 |

*Primary Examiner*—Gerald Goldberg

*Attorney, Agent, or Firm*—William Freedman; Carl L. Silverman

[57] ABSTRACT

In an alternating current electric power system of the type subject to rapid load voltage regulation as a result of variations in reactive load current, reactive load current compensation is provided by fixed capacitors and inductors in parallel with the load, the inductors being in series with static switches which are phase controlled to continuously maintain the net reactive compensating current substantially equal and opposite to the reactive component of load current. Compensation control determines firing time of static switches in accordance with the magnitude of reactive load current. The compensation control includes means rapidly responsive to rapid current disturbances. In one embodiment, the compensation control includes devices for continuously sensing the phase and magnitude of the reactive load current. In another embodiment, the compensation control includes devices for sensing the phase and magnitude of the reactive load current 12 times per cycle of source frequency.

24 Claims, 20 Drawing Figures

(a) WAVEFORMS OF PROJECTED VOLTAGES $V'_{P1}, V'_{P2}, V'_{P3}$ (b) PULSES GENERATED AT ZERO CROSSINGS OF $V'_{P1}, V'_{P2}, V'_{P3}$ (c) PULSES GENERATED AT ZERO CROSSINGS OF $V'_{P1} - V'_{P2}, V'_{P2} - V'_{P3}, V'_{P3} - V'_{P1}$

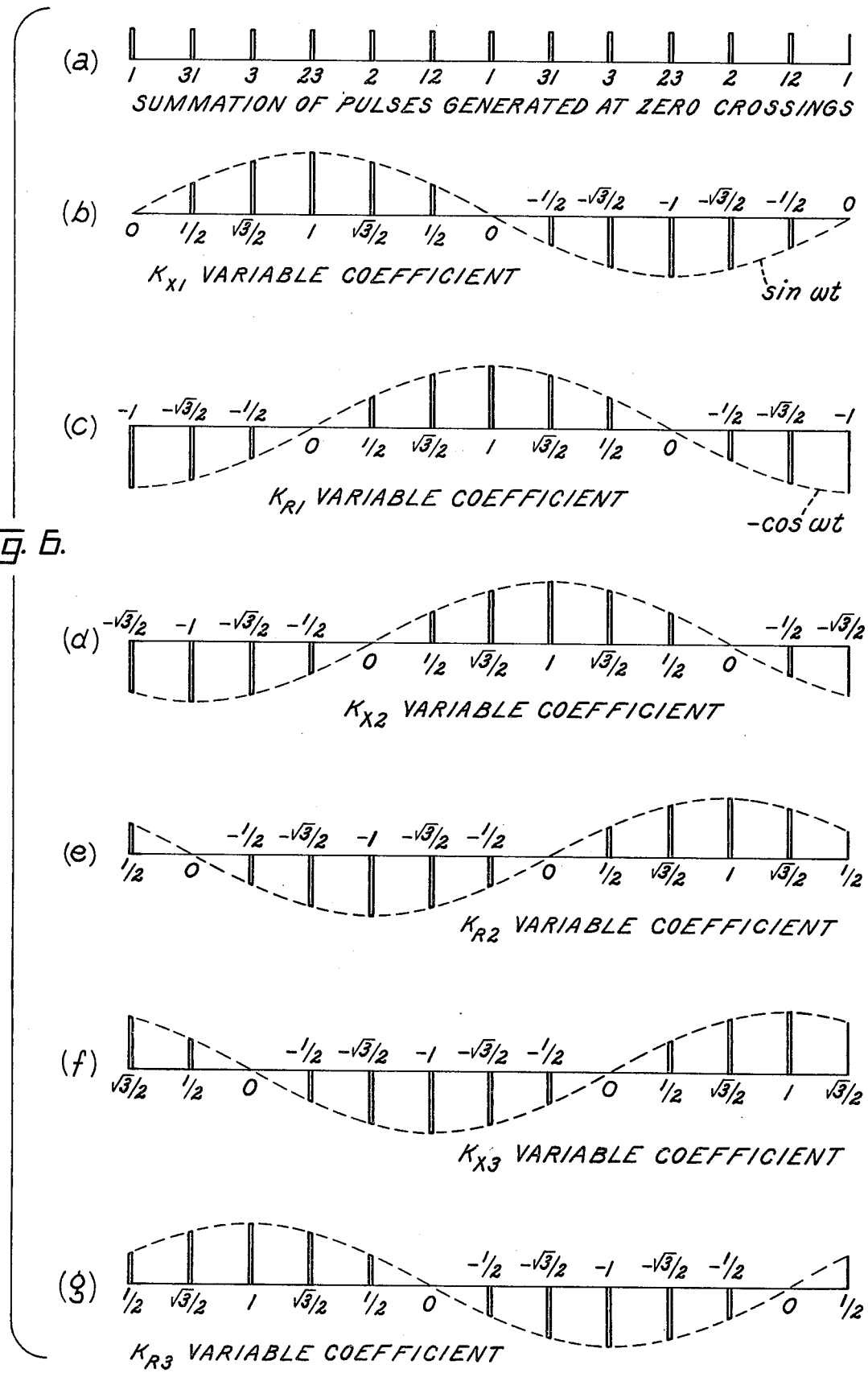

APPARATUS FOR SENSING THE REACTIVE OR REAL COMPONENTS OF CURRENT

BACKGROUND

The present invention relates to control of compensating impedance connected to supply leading or lagging reactive current to an electric power for stabilization of voltage at a critical bus area, and particularly to a control system responsive to rapid current disturbances.

It is knows that electric power systems which supply highly erratic reactive loads, e.g., electric arc furnaces, are typically characterized by poor voltage regulation. Consequently, these systems often exhibit an undesirable flicker. One system suggested to alleviate this condition is disclosed in U.S. Pat. Nos. 3,936,727 and 3,948,432, respectively issued to Kelley et al. and Kelley, on Feb. 3, 1976 and July 6, 1976. These patents are assigned to the assignee of the present application and are hereby incorporated by reference in the present application.

Generally, the Kelley et al. — Kelley system includes the use of two control loops: one open compensating control loop; and one closed regulating or supervisory control loop. The compensating control loop senses the reactive load current component and attempts to negate the same by providing the appropriate compensating reactive current component through a reactive converter which includes capacitive and inductive components. The regulating or supervisory control loop employs a current angle sensor to sense the power factor or phase angle at a selected line location which is typically located in a critical area of the line at which good voltage regulation is desired. These two loops cooperate to generally provide a satisfactory degree of voltage regulation when an erratic load is present.

Although the Kelley et al. — Kelley system is generally satisfactory, its compensating effects are limited by time delays which occur in the sensing of the reactive load current and in the compensating of the sensed reactive load current. More particularly, referring only to the time delay in the "sensing" operation, the reactive load current is sensed two times per cycle of source frequency, i.e., at the zero crossings of the associated projected voltage wavetrain. This twice per cycle sensing of the reactive load current represents an undesirable response time limitation on the Kelley et al. — Kelley control system, especially in situations where rapid current disturbances occur.

An object of this invention is to provide a more rapidly responsive a-c electric power system in which voltage regulation is provided through reactive load current component sensing.

Another object of this invention is to provide such an electric power system in which the reactive load current component is sensed more than two times per cycle of source frequency.

Another object of this invention is to provide such an electric power system in which the reactive load current component is sensed continuously.

Another object of this invention is to provide an electric power system sensing mechanism for the determination of real or reactive components of current more than two times per cycle of source frequency.

SUMMARY OF THE INVENTION

An a-c power system is provided with a regulating system involving the compensation of reactive current drawn by a load through the use of a reactive converter which can deliver to the system leading or lagging compensating current which is substantially equal and opposite to the reactive load current. Compensation of the reactive load current includes means for generating a signal representative of the phase relation and magnitude of the reactive load current component and directing this signal to the control means for the reactive converter which responds to the signal to vary the leading or lagging compensating current delivered by the reactive converter. Means are provided for rendering such a signal representative of the reactive load current component more than two times per cycle of source frequency. The regulating system employs a sensing system suitable for applications other than compensation of reactive current.

BRIEF DESCRIPTION OF THE DRAWINGS

FIGS. 2a–2c are respectively associated with the load currents ($I_{L1}$, $I_{L2}$, $I_{L3}$) in separate phases of a three phase system.

FIGS. 6a–6g are a series of graphs associated with the zero crossing pulses of FIGS. 5a–5c showing the values of the variable coefficients of the signal processing networks of FIGS. 4a–4c.

DETAILED DESCRIPTION OF THE INVENTION

Figure 1:
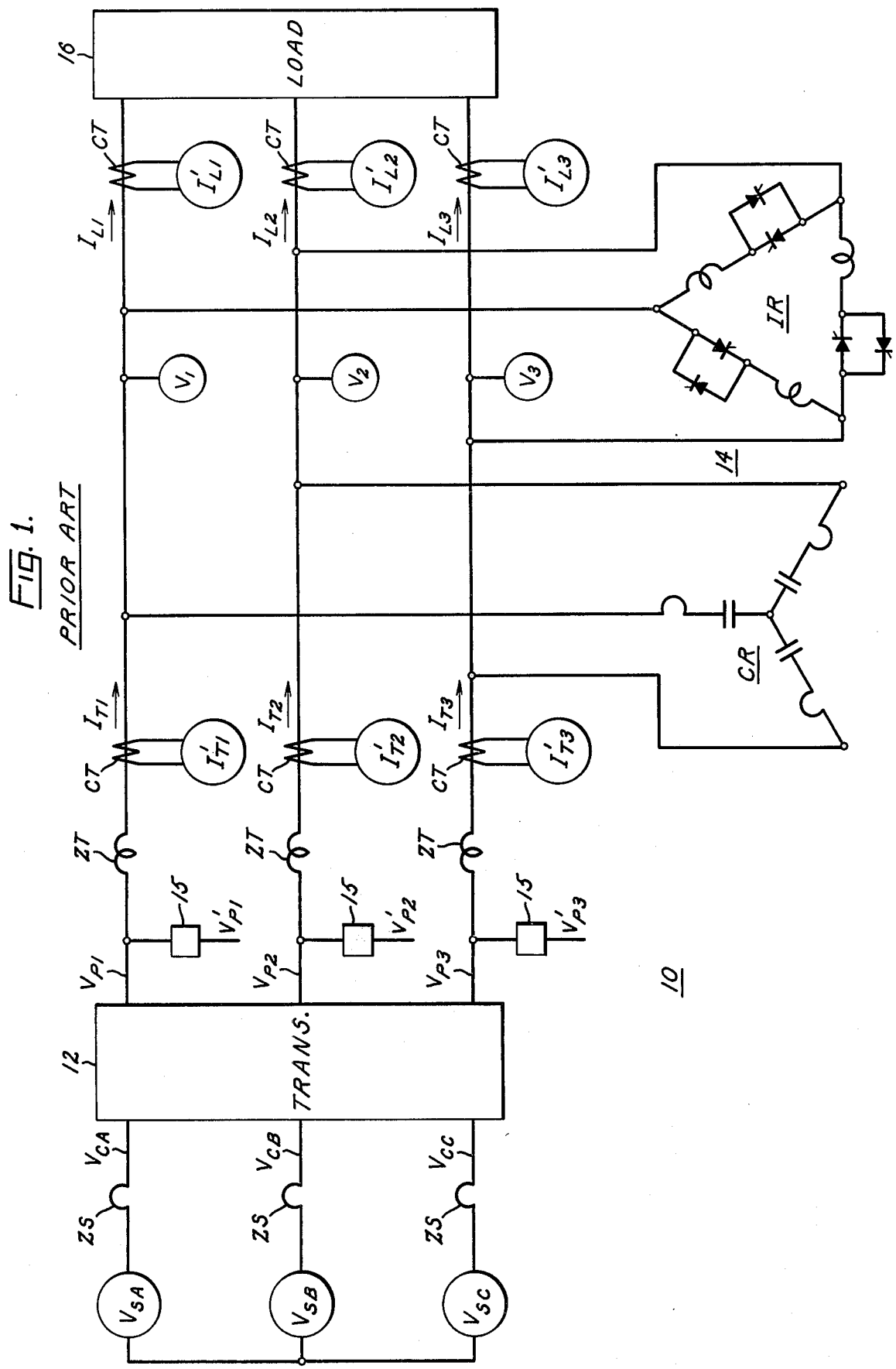
FIG. 1 is a highly schematic representation of one form of an a-c electric power system network of the prior art to which the present invention relates. The network includes a reactive converter for minimizing load disturbance effects at a critical bus area.

Referring initially to FIG. 1, a prior art Kelley et al. — Kelley a-c electrical power system, including a reactive converter 14 for minimizing reactive load disturbance effects, is generally designated 10. The power system 10 includes system voltage sources, designated $V_{SA}$, $V_{SB}$, and $V_{SC}$, each of which represents the line to neutral voltage of one phase of a three phase power system. Each phase further includes a critical bus area at which good voltage regulation is required. The line to neutral voltages at the critical bus area are respectively designated, $V_{CA}$, $V_{CB}$, $V_{CC}$. A system reactance, designated ZS, separates the system voltage sources ($V_{SA}$, $V_{SB}$, $V_{SC}$) from the critical line to neutral bus voltages ($V_{CA}$, $V_{CB}$, $V_{CC}$). A conventional transformer 12 is disposed in the system 10 and produces reactances designated ZT. The transformer 12 connects the critical bus voltages ($V_{CA}$, $V_{CB}$, $V_{CC}$) to a load bus, with voltages designated $V_1$, $V_2$, $V_3$. The load bus ($V_1$, $V_2$, $V_3$) supplies a reactive converter 14 and a load 16. The reactive converter 14 includes a controlled inductive converter and at least one tuned capacitor bank, respectively designated IR and CR. The reactive converter 14, as well as the other elements of the Kelley et al. — Kelley system, are more completely described in previously mentioned U.S. Pat. Nos. 3,936,727 and 3,968,432, which have been incorporated by reference in the present application.

Figure 3:
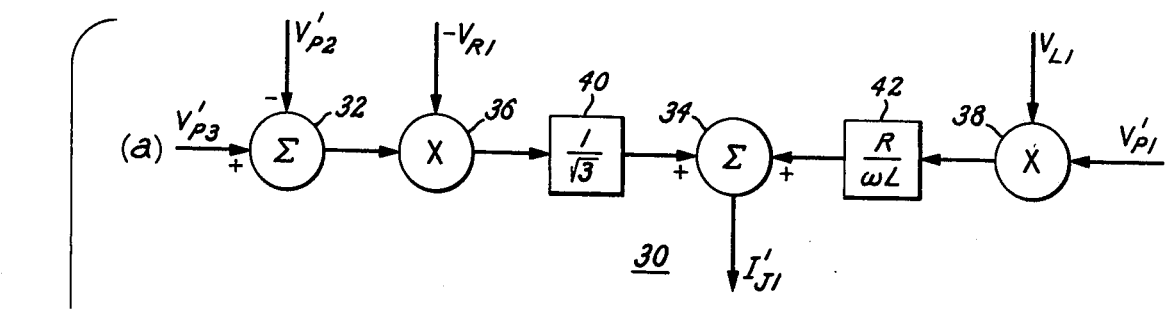
FIGS. 3a–3c are functional block representations of exemplary signal processing networks for an electric power system suitable for use in the present invention. The networks generate output signals respectively representative of the continuous phase relation and magnitude of the reactive load currents in separate phases of a three phase system.
Figure 3:
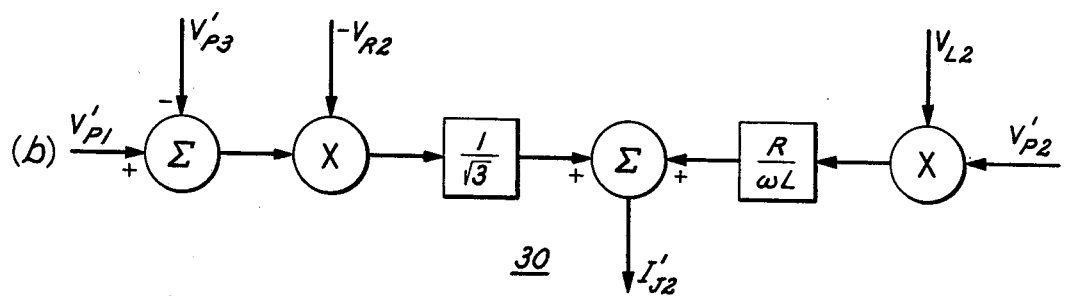
Figure 3:
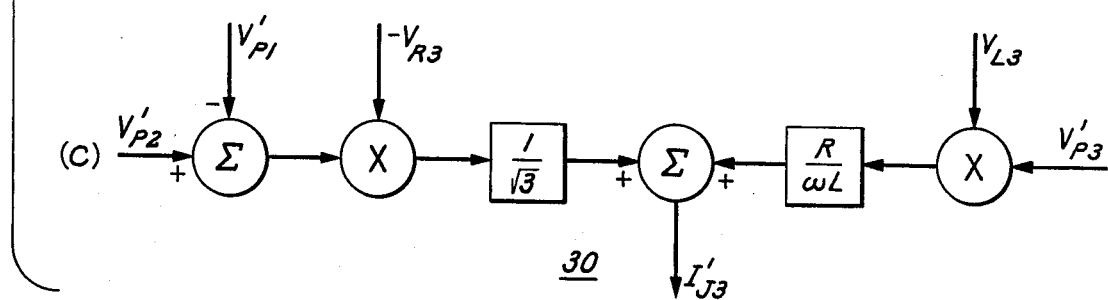

The electrical power system 10 includes means for generating electrical signals representative of various electrical characteristics, e.g., current and voltage. One such signal, designated $V'_{P1}$, $V'_{P2}$, $V'_{P3}$ is representative of the projected voltage i.e., a voltage representative of the line to neutral voltage at the critical bus which takes into account correction required for the reactive effect of the transformer 12. These signals may be obtained through processing means 15 in accordance with U.S. Pat. No. 3,936,727, see especially FIGS. 1 and 3, and column 7, lines 14–37.

The power system 10 also includes means for generating electrical signals representative of current characteristics. Current transformers, designated CT, are provided for this purpose. As shown in FIG. 1, current transformers (CT) are provided at locations in the system 10 so as to generate signals representative of the transformer line current, respectively designated $I'_{T1}$, $I'_{T2}$, $I'_{T3}$ as well as the load current, respectively designated $I'_{L1}$, $I'_{L2}$, $I'_{L3}$. For clarity of description, the representative signals are distinguished from the actual current or voltage value by the inclusion of a prime ('), e.g., $I_{L1}$ and $I'_{L1}$. In connection with the current transformers (CT), the step down ratio is designated T so that the representative current signal $L'_L$ or $I'_T$ is related to the transformer current $I_T$ or load current $I_L$ by the ratio of $T = I/I'$.

Figure 2:
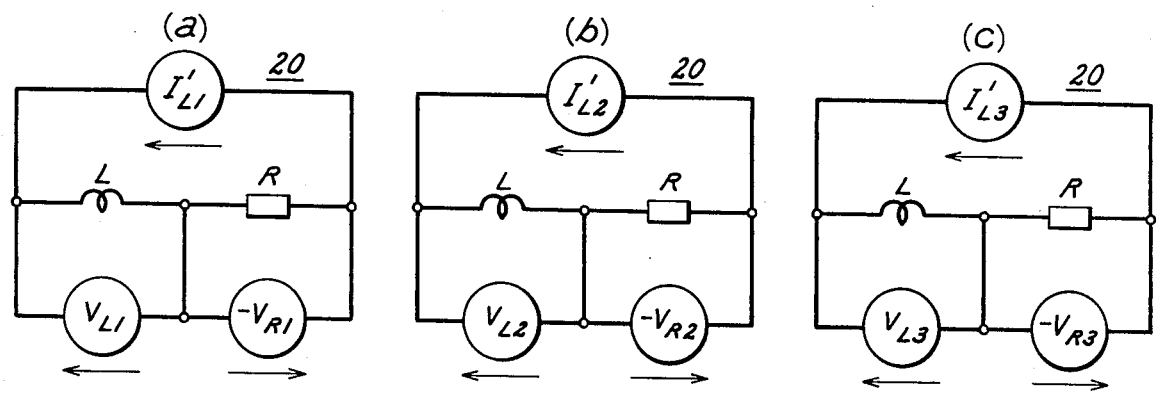
FIGS. 2a–2c show exemplary signal processing circuitry suitable for use in the present invention.

Generally, in the operation of the prior art Kelley et al. — Kelley electrical power system 10 of FIG. 1, load disturbances are attenuated through the operation of the reactive converter 14. The reactive converter 14 is activated by signal inputs representative of the phase relation and magnitude of the reactive load current component. These signal inputs reflect the condition of the reactive load current component at two points in time per cycle of electrical source frequency. That is, in the Kelley et al. — Kelley power system of the prior art, the reactive load current compounds are sensed at the zero crossings of the respective projected voltage wavetrains, see FIG. 2 of U.S. Pat. No. 3,936,727, Kelley et al. The reactive converter 14 receives these inputs two times per cycle of source frequency and produces an output which attempts to negate the reactive load current component by providing the appropriate compensating reactive current component through its IR and CR networks. It is to be noted that, the Kelley et al. — Kelley electrical power system of the prior art, generally described hereinbefore, is more completely set forth in the previously mentioned Kelley et al. — Kelley patents which have been incorporated by reference in the present application.

In accordance with the present invention, the Kelley et al. — Kelley a-c electrical power system is modified by providing rapidly responsive means for activating the reactive converter, i.e., compensating for load disturbances. In one embodiment, a signal which is continuously representative of the phase relation and magnitude of the reactive load current component is generated and provided to the reactive converter. This signal controls the gating angle of trigger signals which periodically fire thyristor switches associated with the reactive converter thereby controlling the amount of inductive current traversing the IR network. Hence, the reactive converter is continuously provided with the substantially real time condition of the reactive load current component. In another embodiment, the reactive converter is provided with a signal which is representative of the reactive load current component twelve times per cycle of source frequency. These two embodiments are to be distinguished from the previously discussed Kelley et al. — Kelley electrical power systems of the prior art in which the reactive converter is activated by a representative signal two times per cycle of source frequency.

Referring now to FIGS. 2a–2c and FIGS. 3a–3c, exemplary signal processing networks suitable for carrying out one form of the present invention are shown. FIGS. 2a–2c and FIGS. 3a–3c depict signal processing networks suitable for each phase of a typical three phase a-c electrical power system. It is to be noted that, although the present invention will be described in connection with the widely employed three phase power system, it is generally applicable to polyphase a-c electrical power systems. FIGS. 2a–2c depict signal processing circuitry suitable for producing output signals which are then employed as some of the input signals for the signal processing networks of FIGS. 3a–3c. The signal processing networks of FIGS. 3a–3c generate output signals which are respectively continuously representative of the reactive components of the load currents in each of the three phases.

Referring now to FIGS. 2a–2c, R-L networks are generally designated 20. The inductor L is preferably linear; if the inductor L exhibits other than trivial resistance, compensation should be provided for the $I'_L \times R_L$ value, where $R_L$ is the resistance of the inductor L. In FIG. 2a, the R-L network 20 receives as its input the signal $I'_{L1}$ which is representative of the load current in one phase of the three phase system. The R-L network 20 produces as outputs signals $V_{L1}$ and $-V_{R1}$, respectively representative of the voltage across the inductor L and the resistor R. The values of the resistor R and inductor L are preferably chosen such that the product of the inductance L and the angular source frequency $\omega$, i.e., $L \times \omega$, is of the order of the magnitude of the resistance R. This relationship causes the output signals $V_{L1}$ and $-V_{R1}$ to be of the same order of magnitude. It is preferable that $V_{L1}$ and $-V_{R1}$ be less than 10 volts to facilitate signal processing. The R-L networks 20 of FIGS. 2b, 2c are substantially identical to the R-L network 20 of FIG. 2a but receive and generate signals associated with the remaining two phases of the three phase system. The R-L networks 20 thus produce the following signal outputs: $V_{L1}$, $-V_{R1}$, $V_{L2}$, $-V_{R2}$, $V_{R3}$, $-V_{R3}$. It is to be noted that the signal outputs $V_{L1}$, $V_{L2}$, $V_{L3}$ are proportional to the time rate of change of the representative load current $I'_L$. The signal outputs $-V_{R1}$, $-V_{R2}$, $-V_{R3}$ are proportional to the representative load current $I'_L$. It is to be noted that, although the use of R-L networks is preferred, other means may be employed to develop signal outputs which are representative of the load current and the time rate of change of the load current.

Referring now to FIGS. 3a–3c, each signal processing network, generally designated 30, includes: two summation devices 32 and 34; two multiplier devices 36 and 38, a $1/\sqrt{3}$ coefficient block 40; and a $R/\omega L$ coefficient block 42. It is to be noted that, in a preferred system, $\omega L = R$, so that the coefficient block 42 may be omitted in such a system. The networks 30 receive signal inputs (including outputs of the networks 20 of FIGS. 2a–2c) and generate output signals $I'_{J1}$, $I'_{J2}$, $I'_{J3}$ which are continuously representative of the reactive load current in each of the three phases. The relationship between the reactive load current ($I_J$) and the representative signal ($I'_J$) is:

$$I'_J \pm \frac{RV_p}{T} \times I_J,$$

where R is taken from FIGS. 2a–2c, T is the step down ratio, and $V_p$ is a constant.

More particularly, referring now to FIG. 3a, the summation device 32 receives as inputs signals $V'_{P2}$ and $V'_{P3}$ which are respectively representative of the critical bus voltages $V_{CB}$ and $V_{CC}$ of FIG. 1. The input signal $V'_{P2}$ is inverted so that the output signal of the summation device 32 comprises $V'_{P3} - V'_{P2}$. This output signal is directed into the multiplier device 36 along with the signal $-V_{R1}$ which is obtained from the signal processing network 20 of FIG. 2a. The output signal of the multiplier device 36 thus comprises $-V_{R1}(V'_{P3} - V'_{P2})$. This output signal is directed to the $1/\sqrt{3}$ coefficient block 40, resulting in an output signal of $(1/\sqrt{3})(-V_{R1})(V'_{P3} - V'_{P2})$. This output signal is directed to one input of summation device 34. Multiplier device 38 receives as inputs signals $V'_{P1}$ and $V_{L1}$. The signal $V'_{P1}$ is representative of the critical bus voltage $V_{CA}$ of FIG. 1 and the signal $V_{L1}$ is obtained from the signal processing network 20 of FIG. 2a. The output signal of multiplier device 38 comprises the product $V_{L1} \times V'_{P1}$. This output signal is directed to the $R/\omega L$ coefficient block 42, resulting in an output signal of $R/\omega L$ ($V_{L1} \times V'_{P1}$). This output signal is directed to a second input of summation device 34. The output signal of the summation device 34 thus comprises a signal representative of $1/\sqrt{3}(-V_{R1})(V'_{P3} - V'_{P2}) + (R/\omega L)(V_{L1} \times V'_{P1})$. This signal is representative of the continuous condition of the reactive load current component and is designated $I'_{J1}$. The input signals associated with the signal processing of the remaining two phases will not be discussed as a similar approach is taken and is shown in FIGS. 3b and 3c.

The output signals $I'_{J1}$, $I'_{J2}$, $I'_{J3}$ of the networks 30 of FIGS. 3a–3c are, for the case of steady sinusoidal reactive load current, unidirectional signals of constant magnitude. The polarity of these signals is dependent upon whether the reactive component of load current is lagging or leading. It is to be noted that these signals correspond to the continuous condition of the reactive load current as distinguished from the two times per cycle representative signals provided in the Kelley et al. — Kelley systems of the prior art.

In connection with the construction of the signal processing networks 20 and 30 of FIGS. 2a–2c, and FIGS. 3a–3c, well known techniques are available: the analog process depicted can be readily implemented by integrated circuits and/or discrete devices. For additional information on suitable signal processing networks, see OPERATIONAL AMPLIFIERS, Design and Applications, Tobey-Graeme-Huelsman, McGraw-Hill Book Company, 1971.

The mathematical aspects of the signal processing networks 20 and 30 shown in FIGS. 2a–2c and FIGS. 3a–3c will now be discussed. The load current $I_L$ can be expressed as:

$$I_L = [I_R^2 + I_J^2]^{\frac{1}{2}} \sin(\omega t \pm \tan^{-1}\frac{I_J}{I_R}),$$

where $I_R$ is the real component and $I_J$ is the reactive component. Thus, the representative signal $I'_L$ is in the following form:

$$I'_L = \frac{1}{T}[I_R^2 + I_J^2]^{\frac{1}{2}} \sin(\omega t \pm \tan \frac{I_J}{I_R}),$$

where T is the ratio of $I_L/I'_L$. In this expression, the + sign represents a leading reactive current and the − sign represents a lagging reactive current.

Since the representative signal $I'_L$ is imposed on the series combination of a resistor R and an inductor L, the following voltages are developed:

$$-V_R = -RI'_L = \frac{-R}{T}[I_R^2 + I_J^2]^{\frac{1}{2}} \sin(\omega t \pm \tan^{-1}\frac{I_J}{I_R});$$

and $$V_L = \frac{L dI'}{dt} = \frac{\omega L}{T}[I_R^2 + I_J^2]^{\frac{1}{2}} \cos(\omega t \pm \tan^{-1}\frac{I_J}{I_R})$$

The signals representative of the projected voltages are in the following form:

$$V'_{P1} = V_P \sin \omega t;$$

$$V'_{P2} = V_P \sin(\omega t - \frac{2\pi}{3}); \text{ and}$$

$$V'_{P3} = V_P \sin(\omega t - 4\pi/3),$$

wherein $V_P$ represents the peak value.

Therefore:

$$V'_{P3} - V'_{P2} = V_P[\sin(\omega t - 4\pi/3) - \sin(\omega t - \frac{2\pi}{3})],$$

which reduces to $$V'_{P3} - V'_{P2} = \sqrt{3} V_P \cos \omega t.$$

Now, referring to the signal processing network 30 of FIG. 3a, $$I'_{J1} = \frac{1}{\sqrt{3}}[-V_R \times (V'_{P3} - V'_{P2})] + \frac{R}{\omega L}[V_L \times V'_{P1}].$$

Through substitution and trigonometric processing:

$$I'_{J1} = \frac{\mp RV_P}{T} \times I_{J1}$$

In the immediately preceding expression, the positive sign (+) is associated with a lagging reactive load current component while the negative sign (−) is associated with a leading reactive load current component.

Thus, in view of the foregoing descriptive and mathematical analysis, it can be seen that the control system of the present invention employs the representative load current signal $I'_L$ for two functions. One function is to generate a signal $(-V_R)$ representative of the load current $(I_L)$. The second function is to generate a signal $(V_L)$ representative of the time rate of change of the load current $(I_L)$. These two signals are then processed, resulting in a signal representative of the reactive load current component. In the preferred embodiment, hereinbefore discussed, the signal processing is such as to generate a signal $I'_J$ which is continuously representative of the reactive load current component.

Although a preferred embodiment of the present invention has been described hereinbefore, modifications are available, and in certain cases, desirable. For instance, for some applications, current harmonics may engender harmonic structure of the signals proportional to the reactive components of current. Such harmonic structures can be attenuated in connection with frequency if there is an undesirably high level of current harmonics. One available technique includes filtering the undesirable frequencies. For example, filtering means can be provided for filtering the output signals $I'_{J1}$, $I'_{J2}$, $I'_{J3}$ of the networks 30 of FIGS. 3a, 3b, 3c.

The preferred embodiment has hereinbefore been described for a power system in which the critical bus voltages ($V_{CA}$, $V_{CB}$, $V_{CC}$), and hence, the projected voltages ($V_{P1}$, $V_{P2}$, $V_{P3}$) and the signals ($V'_{P1}$, $V'_{P2}$, $V'_{P3}$) representative thereof are substantially stable, i.e., stabilized to within 0.25% long time wise and to within a few percent under occasional severe transient conditions. In cases where these voltage values are less stable, additional voltage stabilization means may be desirable. One such voltage stabilization means includes the use of synchronous motors and generators and is well known in the art. Typically, the synchronous motors are driven by the signals representative of the projected voltages. The synchronous motors then drive the generators. In connection with voltage stability, it is to be noted that it is not expected that such stabilizing means will be necessary for most applications.

The preferred embodiment has hereinbefore been described for a power system in which frequency is fairly constant. If the system were to include a variable frequency, additional frequency compensation means may be desirable. One such compensating means may include the use of synchronous motors driven by the representative projected voltages and a dc tachometer connected thereto. In connection with frequency variation, it is to be noted that it is not expected that variable frequency will be present to a degree such that compensating means is either necessary or desirable.

Figure 4:
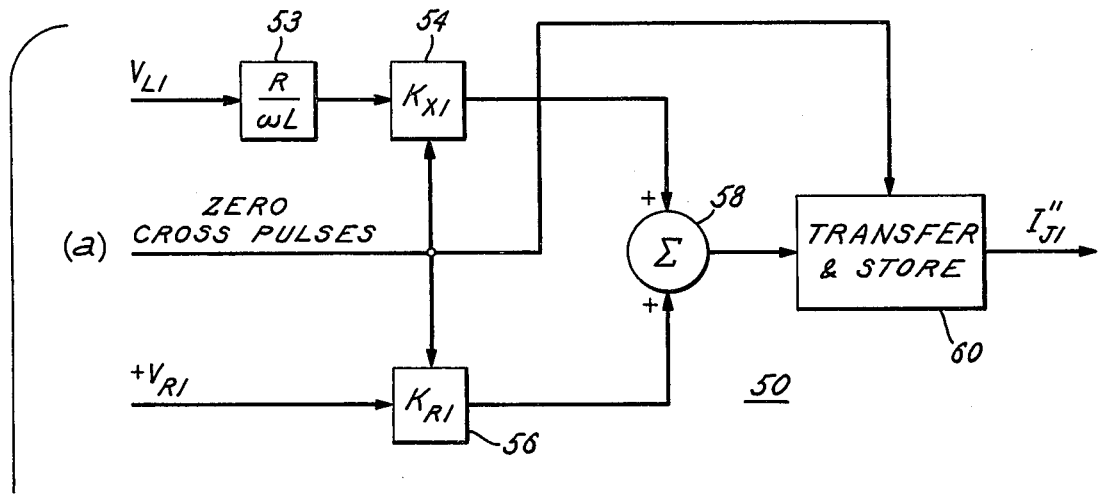
FIGS. 4a–4c are functional block representations of exemplary signal processing networks suitable for use in another embodiment of the present invention. The networks generate output signals 12 times per cycle of source frequency which are respectively representative of the phase relation and magnitude of the reactive load currents in separate phases of a three phase system.
Figure 4:
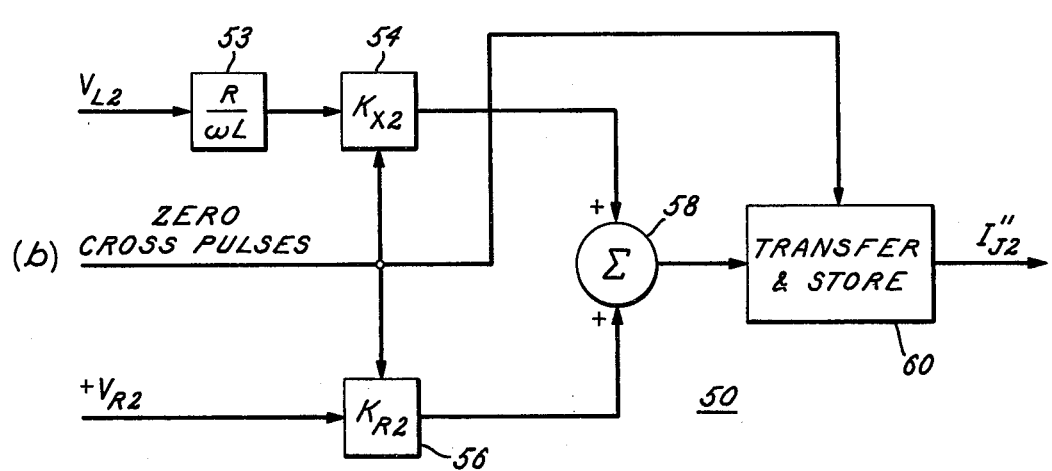
Figure 4:
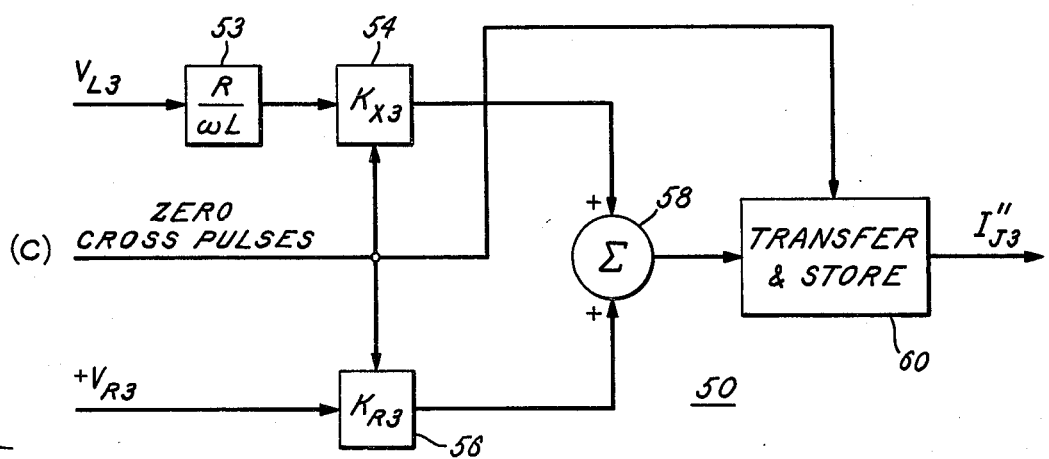

Exemplary signal processing networks for another embodiment of the present invention are shown in block diagram form in FIGS. 4a-4c. In this embodiment, signal processing networks, generally designated 50, sense the reactive component of load current, and generate signals representative thereof, 12 times per cycle of source frequency.

Each of the signal processing networks 50 of FIGS. 4a-4c comprises: an optional $R/\omega L$ coefficient block 53; two variable coefficient blocks 54 and 56; a summation device 58; and a transfer and store device 60. It is to be noted that the 12 time per cycle networks 50 of FIGS. 4a-4c include inputs similar to the inputs of the previously described continuous reactive load current networks 30 of FIGS. 3a-3c. These input values include: $V_{L1}$; $V_{R1}$, $V_{L2}$, $V_{R2}$; $V_{L3}$; $V_{R3}$. Zero cross pulses are provided through conventional processing of signals representative of the projected voltage wavetrains. In this embodiment, twelve zero cross pulses are provided per cycle of source frequency as distinguished from the two zero cross pulses per cycle as in the Kelley et al. — Kelley electrical power system of the prior art.

The signal processing networks 50 produce output signals $I''_{J1}$, $I''_{J2}$, $I''_{J3}$ twelve times per cycle, which are respectively representative of the reactive components of load currents $I_{L1}$, $I_{L2}$, $I_{L3}$. The relationship between the reactive load current ($I_J$) and the representative signal ($I''_J$) is: $I''_J = \pm (R/T) \times I_J$, where R is taken from FIGS. 2a-2c and T is the step down ratio. In connection with the construction of the signal processing networks 50 of FIGS. 4a-4c, well known techniques are available: the analog process depicted can be readily implemented by integrated circuits and/or discrete devices. For additional information on suitable signal processing networks, see *OPERATIONAL AMPLIFIERS, Design and Applications*, Tobey-Graeme-Huelsman, McGraw-Hill Book Company, 1971 which is hereby incorporated by reference in the present application. More particularly, for further information on obtaining zero cross pulses, see pp. 359-360 of *OPERATIONAL AMPLIFIERS*.

Referring now to FIG. 4a and the single phase associated therewith, the coefficient blocks 54 and 56 respectively receive the 12 zero cross pulses per cycle as well as input signals $V_{L1}$ and $V_{R1}$. The output signals of the coefficient blocks 54 and 56 at instants corresponding to each of the zero cross pulses are directed into the summation device 58. The variable coefficients, designated $K_{X1}$, $K_{R1}$, have values which change twelve times per cycle. The output signal of the summation device 58 and the zero cross pulses are directed into the transfer and store device 60. Each discrete zero cross output signal directs the transfer and store device 60 to allow the output of the summation device 58 to be directed therethrough resulting in an output signal $I''_{J1}$ which is representative of the reactive load current component at the last zero cross pulse time. The output signal $I''_{J1}$ is stored and continuously generated by the transfer and store device 60 until the next zero crossing pulse input. Thus, the signal processing network 50 of FIG. 4a updates the representative signal $I''_{J1}$ twelve time per cycle of source frequency. FIGS. 4b-4c show substantially the same networks 50 associated with the signal processing for producing output signals $I''_{J2}$, $I''_{J3}$, twelve time per cycle, which are respectively representative of the reactive load current components in the remaining two phases of the three phase system.

Figure 5:
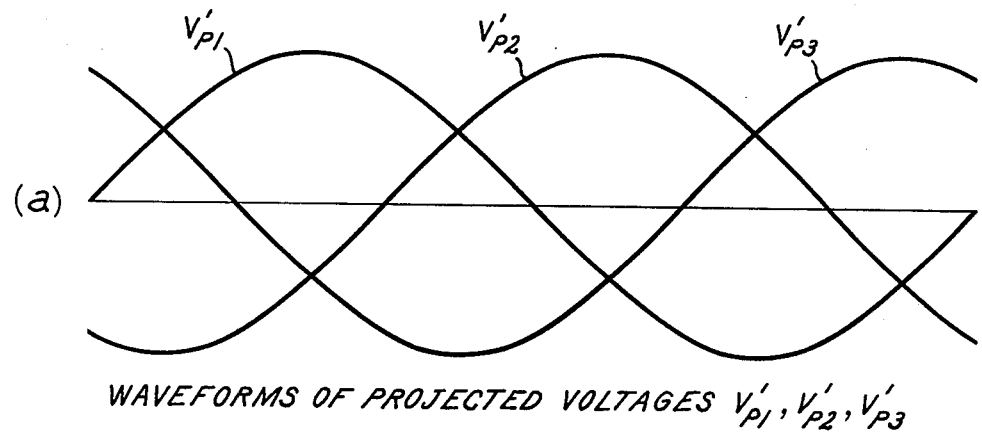
FIGS. 5a–5c are representations of the wave forms and pulse forms associated with the functional block representations of FIGS. 4a–4c.
Figure 5:
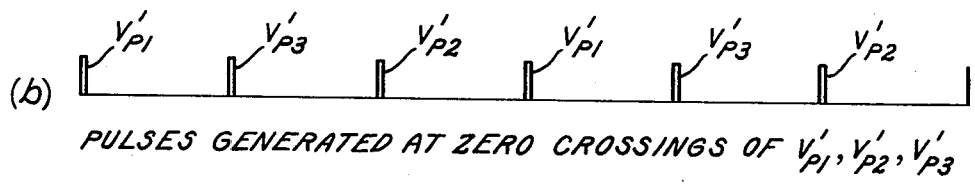
Figure 5:
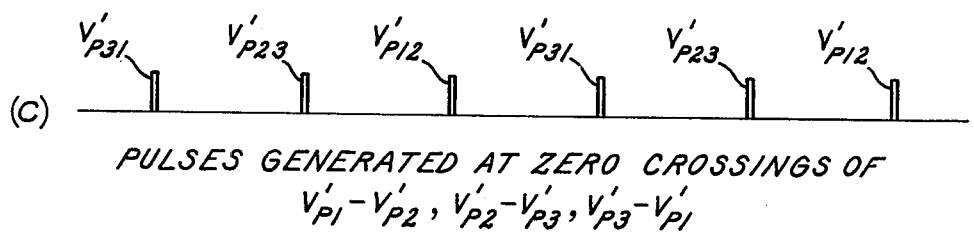

The operation of the signal processing networks 50 shown in FIGS. 4a-4c can be more clearly understood by referring now to FIGS. 5 & 6 which diagrammatically show waveforms associated therewith. FIGS. 5a-5c show the waveforms of representative projected voltage signals $V'_{P1}$, $V'_{P2}$ and $V'_{P3}$ and the twelve zero crossings associated therewith. More particularly, FIG. 5b shows the pulses generated at zero crossings of $V'_{P1}$, $V'_{P2}$ and $V'_{P3}$ waveforms. FIG. 5c shows the additional pulses generated at zero crossings of $V'_{P1} - V'_{P2}$, $V'_{P2} - V'_{P3}$, and $V'_{P3} - V'_{P1}$. In FIG. 5c, the additional pulses are conveniently referred to as $V'_{P12}$, $V'_{P23}$, and $V'_{P31}$. It is to be noted that twelve zero crossing pulses are generated in this system per cycle of source frequency: six zero cross pulses are generated in FIG. 5b and an additional six zero cross pulses are generated in FIG. 5c.

Referring now to FIGS. 6a–6g, the relationship of the variable coefficients, $K_{X1}$, $K_{R1}$, $K_{X2}$, $K_{R2}$, and $K_{X3}$, $K_{R3}$, of the signal processing networks of FIGS. 4a–4c to the zero crossing pulses of FIGS. 5a–5c will be more fully discussed.

In FIG. 6a, the twelve zero cross pulses per cycle are shown. The pulses appear each 30° during the 360° cycle. Referring now to FIG. 6b, the values of the variable coefficient $K_{X1}$ at each zero cross pulse are shown. Note that the twelve values of $K_{X1}$ are actually discrete points along a profile of the waveform associated with the $V'_{P1}$ signal. The $V'_{P1}$ waveform is shown as a dashed line. The twelve values of $K_{X1}$ are taken at each of the consecutive twelve zero crossings within one cycle of the $V'_{P1}$ waveform. In this connection, note that the $V'_{P1}$ waveform is in the form of a sine wave ($V_P \sin \omega t$ with $V_P$ taken as unity) such that each of the 12 values of $K_{X1}$ simply corresponds to the sine value at 0°, 30°, 60°, ... 360°. Referring now to FIG. 6c, the value of the variable coefficient $K_{R1}$ at each zero cross pulse is shown. Note that the twelve values of $K_{R1}$ are actually discrete points along a profile of the waveform associated with the $V'_{P3} - V'_{P2}$ signal. This waveform corresponds to the −cosine value ($-V_P \cos \omega t$ with $V_P$ taken as unity) at the same 0°, 30°, 60°, ... 360°.

Referring again to 4a, the operation of the signal processing network 50 will now be more completely described. The variable coefficient block 54 includes twelve values which represent the magnitude of the sine waveform (sin $\omega t$) of FIG. 6b at each of the twelve zero crossing pulses. Each time a zero cross pulse is directed into the variable coefficient block 54, the quantity $V_{L1}$ is multiplied by one of the twelve values. The twelve values of the variable coefficient are associated with each complete cycle and are repeated each subsequent cycle. Thus, the product of $V_{L1}$ and $K_{X1}$ is updated each consecutive 30° of the cycle, i.e., twelve times per cycle. This updated value is directed to the summation device 58. Similarly, the variable coefficient block 56 includes twelve values which represent the magnitude of the −cosine waveform (−cos $\omega t$) of FIG. 6c at each of the twelve zero crossing pulses. The twelve values of the variable coefficient block 56 are associated with each complete cycle and are repeated each subsequent cycle. As a result, the summation device 58 receives signals whose sum is representative of the reactive load current at each time instant associated with each one of the twelve zero cross pulses. This summed signal is directed to the transfer and store device 60 where it is stored and transferred as an output signal $I''_{J1}$ until the next zero crossing pulse results in an output signal $I''_{J1}$ unequal to the previous $I''_{J1}$ signal. This process continues 12 times per cycle and is repeated in subsequent cycles.

The $K_{X2}$, $K_{R2}$ coefficient values shown in FIGS. 6d, 6e are similar to the previously described $K_{X1}$, $K_{R1}$ coefficient values. However, the profile waveform for this phase is shifted − 120° with respect to phase 1 in accordance with conventional three phase power system usage. Similarly, the profile waveform for the $K_{X3}$, $K_{R3}$ coefficient values is shifted − 120° with respect to phase 2. Then, as described hereinbefore, the coefficient value at each of the zero crossing points is simply determined.

The twelve time per cycle signal processing networks 50 of FIGS. 4a–4c can be modified, if desired, to result in a network which updates the sensed value of the reactive load current either less than, or more than twelve times per cycle. For example, it is quite simple to operate at six times per cycle by omitting the zero cross pulses of either FIG. 5b or FIG. 5c. Or, other updating modes less than twelve times per cycle are available by omitting selective ones of the twelve zero cross pulses. In this manner, updating modes between two and twelve times per cycle are available. On the other hand, updating modes greater than twelve times per cycle are available by employing additional zero crossing values. For example, by employing known phase shifting techniques with the representative projected voltages $V'_{P1}$, $V'_{P2}$, $V'_{P3}$, additional zero crossings are provided.

Thus, the present invention provides a highly responsive control system for use in an a-c electrical power system, especially for use in connection with an erratic reactive load. The control system is flexible in that the responsiveness of the means for sensing the condition of the reactive load current and generating a signal representative thereof can be varied. For example, such a signal can be rendered representative continuously, twelve times per cycle, less than twelve times per cycle, or more than twelve times per cycle. This flexibility is to be distinguished from the two times per cycle Kelley et al. — Kelley systems of the prior art as disclosed in previously mentioned U.S. Pat. Nos. 3,936,727 and 3,968,432.

It may be useful, for certain applications, to determine the reactive components of the transformer currents $I_{T1}$, $I_{T2}$, $I_{T3}$ shown in FIG. 1. In this situation, the representative signals $I'_{T1}$, $I'_{T2}$, $I'_{T3}$ may be substituted for the representative load current signals $I'_{L1}$, $I'_{L2}$, $I'_{L3}$.

Also, although the present invention has hereinbefore been described in connection with the reactive components of current, it is also applicable to systems in which the condition of the real component of current is of importance. For this application, the continuously sensing system can be modified by considering the following relationships:

$$I'_{R1} = V'_{P1} \times V_{R1} + \frac{R}{\sqrt{3}\ \omega L} [V_{L1} \times (V'_{P3} - V'_{P2})];$$

$$I'_{R2} = V'_{P2} \times V_{R2} + \frac{R}{\sqrt{3}\ \omega L} [V_{L2} \times (V'_{P1} - V'_{P3})]; \text{ and}$$

$$I'_{R3} = V'_{P3} \times V_{R3} + \frac{R}{\sqrt{3}\ \omega L} [V_{L3} \times (V'_{P2} - V'_{P1})],$$

$$\text{where } I'_R = \frac{RV_P}{T} \times I_R$$

and the three real currents are $I_{R1}$, $I_{R2}$, $I_{R3}$.

Similarly, the twelve time per cycle of source frequency embodiment of the present invention can be modified so as to generate signals representative of the real components of current. For example, referring to FIG. 4a, the profile of the variable coefficient $K_{R1}$ can be a sine wave and the profile of the variable coefficient $K_{X1}$ can be made to be a cosine wave. This relationship causes the output of the transfer and store device 60 to be the real component of current which is associated with phase 1. The other variable coefficients can be as follows: $K_{R2}$ profile of sin ($\omega t - 2\pi/3$); $K_{R3}$ profile of sin ($\omega t - 4\pi/3$); $K_{X2}$ profile of cos ($\omega t - 2\pi/3$); and $K_{X3}$ profile of cos ($\omega t - 4\pi/3$).

In addition, although the present invention has hereinbefore been described in connection with a regulating system involving the compensation of reactive current drawn by a load, it is generally applicable to those situations in which rapid responsive sensing of a predetermined component of system current is desirable.

While I have illustrated preferred embodiments of my invention by way of illustration, many modifications will occur to those skilled in the art and I therefore wish to have it understood that I intend in the appended claims to cover all such modifications as fall within the true spirit and scope of my invention.

What is claimed as new and desired to be secured by Letters Patent of the United States is:

1. Reactive current supply apparatus for an a-c electric power system including a critical voltage supply bus electrically separated by series impedance from load terminals which are adapted for connection to a load subject to rapid oscillatory variation of reactive current demand comprising: fixed capacitor means connected across said load terminals, fixed inductor means connected across said load terminals in series circuit relation with static switching means, said static switching means including gating means for phase controlling the conduction angle of said switching means thereby to control the magnitude of reactive current traversing said inductor means, means for generating a first electrical signal representative in direction of a phase relation of the reactive component of load current at said load terminals and representative in magnitude of the magnitude of said reactive component of load current, means responsive to said first electrical signal for so controlling said gating means that the sum of the reactive current traversing said fixed capacitor means and said fixed inductor means is substantially equal and opposite to said reactive component of load current, wherein said means for generating said first electrical signal representative of the phase relation and magnitude of said reactive component of load current further comprises:

means for rendering said first electrical signal representative of the phase relation and magnitude of said reactive component of load current more than two times per cycle of source frequency, said rendering means including means for generating second and third electrical signals respectively representative of said load current and the time rate of change of said load current, said rendering means including signal processing means for processing said second and third electrical signals with electrical signals representative of line to neutral voltage waveforms which are derived from a selected reference location in said power system.

2. Reactive current supply apparatus in accordance with claim 1 in which said means for generating said second and third signals representative of said load current and the time rate of change of said load current comprises at least one R-L network.

3. Reactive current supply apparatus in accordance with claim 1 wherein said means for rendering said first electrical signal representative of the phase relation and magnitude of said reactive component of load current comprises means for rendering said first electrical signal representative of the phase relation and magnitude of said reactive component of load current twelve times per cycle of source frequency.

4. Reactive current supply apparatus in accordance with claim 3 in which said rendering means includes means for generating twelve zero crossing pulses per cycle of source frequency and pulse processing means for generating an output signal which is representative of the phase relation and magnitude of said reactive component of load current at each of said twelve zero crossing pulses per cycle of source frequency.

5. Reactive current supply apparatus in accordance with claim 4 in which said means for generating said twelve zero crossing pulses per cycle comprises summation means for processing said electrical signals representative of line to neutral voltage waveforms at said critical voltage bus.

6. Reactive current supply apparatus in accordance with claim 5 in which said pulse processing means includes: first means for developing a first intermediate signal representative of the product of said second representative signal and a first variable coefficient at each time instant corresponding to each one of said twelve zero crossing pulses per cycle and second means for developing a second intermediate signal representative of the product of said third representative signal and a second variable coefficient at each of said time instants; and means for summing said intermediate signals and generating an output signal representative of said summed intermediate signals at each of said time instants.

7. Reactive current supply apparatus in accordance with claim 6 in which said means for generating said output signal representative of said summed intermediate signals includes means for continuing to generate said output signal representative of said summed intermediate signals during the time interval between consecutive ones of said zero crossing pulses.

8. Reactive current supply apparatus in accordance with claim 7 in which said second variable coefficient represents the value of one of said electrical signals representative of line to neutral voltage waveforms at said critical voltage bus and said first variable coefficient represents the value of the difference between the two remaining electrical signals representative of line to neutral voltage waveforms at said critical voltage bus in a three phase a-c electric power system.

9. Reactive current supply apparatus in accordance with claim 1 wherein said means for rendering said first electrical signal representative of the phase relation and magnitude of said reactive component of load current comprises means for rendering said first signal continuously representative of the phase relation and magnitude of said reactive component of load current during each cycle of source frequency.

10. Reactive current supply apparatus in accordance with claim 9 in which said means for generating said second and third signals representative of said load current and the time rate of change of said load current comprises at least one R-L network.

11. Reactive current supply apparatus in accordance with claim 10 for a three phase a-c electric power system, which further comprises:
  (a) first summation means for processing electrical signals representative of the line to neutral voltage waveforms in two phases of said three phase system at said critical bus and generating an output signal therefrom;
  (b) first multiplier means for receiving said output signal of said first summation means and said second signal representative of said load current and generating an output signal representative of the product thereof;
  (c) first coefficient block means for multiplying said first multiplying means output signal by the value of about $1/\sqrt{3}$ and generating an output signal therefrom;

(d) second multiplier means for receiving an electrical signal representative of the remaining line to neutral voltage waveform of the third phase at said critical bus and said third signal representative of the time rate of change of said load current and generating an output signal representative of the product thereof, (e) second coefficient block means for multiplying said second multiplier means output signal by a value $R/\omega L$ and generating an output signal therefrom, where R comprises the resistance and L comprises the inductance in said R-L network; and, (f) second summation means for receiving said output signals of said first and second coefficient blocks and generating an output signal therefrom which is continuously representative of the sum of said output signals of said first and second coefficient blocks.

12. System for sensing a predetermined component of system current in a polyphase a-c electric power system, which comprises:

(a) means for generating a first electrical signal representative of said system current at a selected area in said power system;

(b) means for generating a second electrical signal representative of the time rate of change of said system current at said selected area in said power system;

(c) means for deriving electrical signals representative of line to neutral voltage waveforms associated with said polyphase power system at a selected reference location in said power system;

(d) signal processing means for processing said first and second electrical signals with said signals representative of line to neutral voltage waveforms, said signal processing means including means for generating an output signal therefrom, said output signal being representative of said predetermined component more than two times per cycle of source frequency.

13. System in accordance with claim 12 which includes means for generating an intermediate signal representative of said system current at said selected area and in which said means for generating said first and second electrical signals comprises at least one R-L network for receiving said intermediate signal.

14. System in accordance with claim 12 in which said system current comprises load current.

15. System in accordance with claim 14 in which said predetermined component comprises the real component of said load current.

16. System in accordance with claim 14 in which said predetermined component comprises the reactive component of said load current.

17. System in accordance with claim 16 in which said output signal is continuously representative of said reactive component of said load current.

18. System in accordance with claim 17 for a three phase a-c electric power system which includes means for generating an intermediate signal representative of said load current and in which said means for generating said first and second electrical signals comprises at least one R-L network for receiving said intermediate signal and in which said signal processing means further comprises:

(a) first summation means for processing electrical signals representative of said line to neutral voltage waveforms in two phases of said three phase system at said selected reference location and generating an output signal therefrom;

(b) first multiplier means for receiving said output signal of said first summation means and said first signal representative of said load current and generating an output signal representative of the product thereof;

(c) first coefficient block means for multiplying said first multiplying means output signal by the value of about $1/\sqrt{3}$ and generating an output signal therefrom;

(d) second multiplier means for receiving an electrical signal representative of the remaining line to neutral voltage waveform of the third phase at said selected reference location and said second signal representative of the time rate of change of said load current and generating an output signal representative of the product thereof;

(e) second coefficient block means for multiplying said second multiplier means output signal by a value $R/\omega L$ and generating an output signal therefrom, where R comprises the resistance and L comprises the inductance in said R-L network; and, (f) second summation means for receiving said output signals of said first and second coefficient blocks and generating an output signal therefrom which is continuously representative of the sum of said output signals of said first and second coefficient blocks.

19. System in accordance with claim 16 in which said output signal is representative of said reactive component of said load current twelve times per cycle of source frequency.

20. System in accordance with claim 19 for a three phase a-c electric power system in which said signal processing means includes means for generating twelve zero crossing pulses per cycle of source frequency and pulse processing means for generating an output signal which is representative of the phase relation and magnitude of said reactive component of load current at each of said twelve zero crossing pulses per cycle of source frequency.

21. System in accordance with claim 20 in which said means for generating said twelve zero crossing pulses per cycle comprises summation means for processing said signals representative of line to neutral voltage waveforms.

22. System in accordance with claim 21 in which said pulse processing means comprises:

(a) first means for developing a first intermediate signal representative of the product of said first representative signal and a first variable coefficient at each instant corresponding to each one of said twelve zero crossing pulses per cycle;

(b) second means for developing a second intermediate signal representative of the product of said second representative signal and a second variable coefficient at each of said time instants; and (c) means for summing said intermediate signals and generating an output signal representative of said summed intermediate signals at each of said time instants.

23. System in accordance with claim 22 in which said means for generating said output signal representative of said summed intermediate signals includes means for continuing to generate said output signal during the time interval between consecutive ones of said zero crossing pulses.

24. System in accordance with claim 23 in which said second variable coefficient represents the value of one of said electrical signals representative of line to neutral voltage waveforms at said selected reference location, and said first variable coefficient represents the value of the difference between the two remaining electrical signals representative of line to neutral voltage waveforms at said selected reference location.

* * * * *